US00RE50947E

(19) United States
(12) Reissued Patent
Kawazu

(10) Patent Number: US RE50,947 E
(45) Date of Reissued Patent: Jul. 7, 2026

(54) HIGH-FREQUENCY BOARD, HIGH-FREQUENCY PACKAGE, AND HIGH-FREQUENCY MODULE

(71) Applicant: KYOCERA Corporation, Kyoto (JP)

(72) Inventor: Yoshiki Kawazu, Higashiomi-city (JP)

(73) Assignee: KYOCERA CORPORATION, Kyoto (JP)

(21) Appl. No.: 18/082,181

(22) Filed: Dec. 15, 2022

Related U.S. Patent Documents

Reissue of:
(64) Patent No.: 10,869,387
Issued: Dec. 15, 2020
Appl. No.: 16/343,534
PCT Filed: Sep. 11, 2017
PCT No.: PCT/JP2017/032658
§ 371 (c)(1),
(2) Date: Apr. 19, 2019
PCT Pub. No.: WO2018/074100
PCT Pub. Date: Apr. 26, 2018

(30) Foreign Application Priority Data

Oct. 21, 2016 (JP) ..... 2016-206673

(51) Int. Cl.
*H05K 1/02* (2006.01)
*H05K 1/11* (2006.01)
*H05K 1/18* (2026.01)
*H10W 70/60* (2026.01)
(Continued)

(52) U.S. Cl.
CPC ..... *H05K 1/0243* (2013.01); *H05K 1/02* (2013.01); *H05K 1/115* (2013.01); *H05K 1/18* (2013.01); *H10W 70/60* (2026.01); *H10W 70/68* (2026.01); *H10W 76/10* (2026.01)

(58) Field of Classification Search
CPC .... H05K 1/0231; H05K 1/115; H05K 3/4629; H05K 1/024; H05K 1/02; H05K 1/0243; H05K 1/18; H05K 2201/09072; H05K 2201/0187; H05K 1/0245; H05K 2201/09063; H05K 1/0306; H05K 1/0253;
(Continued)

(56) References Cited

U.S. PATENT DOCUMENTS 5,426,399 A 6/1995 Matsubayashi et al.
2001/0004942 A1* 6/2001 Rehm ..... H05K 1/0231 174/260
(Continued)

FOREIGN PATENT DOCUMENTS

JP 56-112969 U1 8/1981
JP 11-214556 A 8/1999
(Continued)

*Primary Examiner* — Christina Y. Leung
(74) *Attorney, Agent, or Firm* — Volpe Koenig

(57) ABSTRACT

A high-frequency board includes an insulating substrate, a first line conductor, and a second line conductor. The insulating substrate has an upper surface with a recess. The first line conductor is located on the upper surface of the insulating substrate. The second line conductor is located on the upper surface of the insulating substrate and extends parallel to the first line conductor with a space from the first line conductor as viewed from above. The recess is located between the first line conductor and the second line conductor, and has a lower dielectric constant than the insulating substrate.

33 Claims, 18 Drawing Sheets

(51) Int. Cl.
*H10W 70/68* (2026.01)
*H10W 76/10* (2026.01)

(58) Field of Classification Search
CPC ..... H01P 5/028; H01L 23/12; H01L 23/13; H01L 23/02
See application file for complete search history.

(56) References Cited

U.S. PATENT DOCUMENTS

| | | | | |
|---|---|---|---|---|
| 2004/0131318 | A1* | 7/2004 | Mori | G02B 6/4201 385/92 |
| 2006/0018104 | A1 | 1/2006 | Katayama et al. | |
| 2008/0048796 | A1 | 2/2008 | Shaul et al. | |
| 2009/0059540 | A1* | 3/2009 | Giboney | H05K 9/0056 361/739 |
| 2010/0308940 | A1* | 12/2010 | Shirasaki | H01L 23/047 333/22 R |
| 2013/0155632 | A1* | 6/2013 | Lo | H05K 1/028 361/749 |
| 2013/0228366 | A1* | 9/2013 | Lam | H05K 1/0245 174/260 |

FOREIGN PATENT DOCUMENTS

| | | | | |
|---|---|---|---|---|
| JP | 2008125038 | A | * | 5/2008 |
| JP | 2008-311682 | A | | 12/2008 |
| JP | 2012-227882 | A | | 11/2012 |
| JP | 2012-227887 | A | | 11/2012 |

* cited by examiner

HIGH-FREQUENCY BOARD, HIGH-FREQUENCY PACKAGE, AND HIGH-FREQUENCY MODULE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD

The present invention relates to a high-frequency board, a high-frequency package including a high-frequency board, and a high-frequency module.

BACKGROUND

As wireless communication devices including mobile phones are used widely, these devices operate at increasingly higher frequencies to transmit larger volumes of information at higher speed. A known high-frequency board includes a capacitor located between portions of a signal line to remove the direct-current (DC) voltage component that transmits high-frequency signals (refer to Japanese Patent Application Publication No. 2008-311682).

A high-frequency board described in Japanese Patent Application Publication No. 2008-311682 includes a first line conductor and a second line conductor for transmitting signals to a dielectric substrate. The first and second line conductors extend parallel to each other. However, the board described in Patent Literature 1 may decrease the impedance between the first and second line conductors, and may have much loss in transmission of high-frequency signals.

BRIEF SUMMARY

A high-frequency board according to one aspect of the present invention includes an insulating substrate, a first line conductor, and a second line conductor. The insulating substrate has an upper surface with a recess. The first line conductor is located on the upper surface of the insulating substrate. The second line conductor is located on the upper surface of the insulating substrate and extends parallel to the first line conductor with a space from the first line conductor as viewed from above. The recess is located between the first line conductor and the second line conductor, and has a lower dielectric constant than the insulating substrate.

A high-frequency package according to another aspect of the present invention includes a base, a frame, and the high-frequency board according to the above aspect. The frame is bonded to an upper surface of the base, and has a through-hole. The high-frequency board is fixed in the through-hole of the frame.

A high-frequency module according to another aspect of the present invention includes the high-frequency package according to the above aspect, a semiconductor device, and a lid. The semiconductor device is housed in the high-frequency package and electrically connected to the high-frequency board. The lid is joined to an upper end of the frame, and covers the semiconductor device and an inside of the high-frequency package.

DETAILED DESCRIPTION

A high-frequency board according to one or more embodiments of the present invention will now be described with reference to the drawings.

Structure of High-Frequency Board

Figure 1:
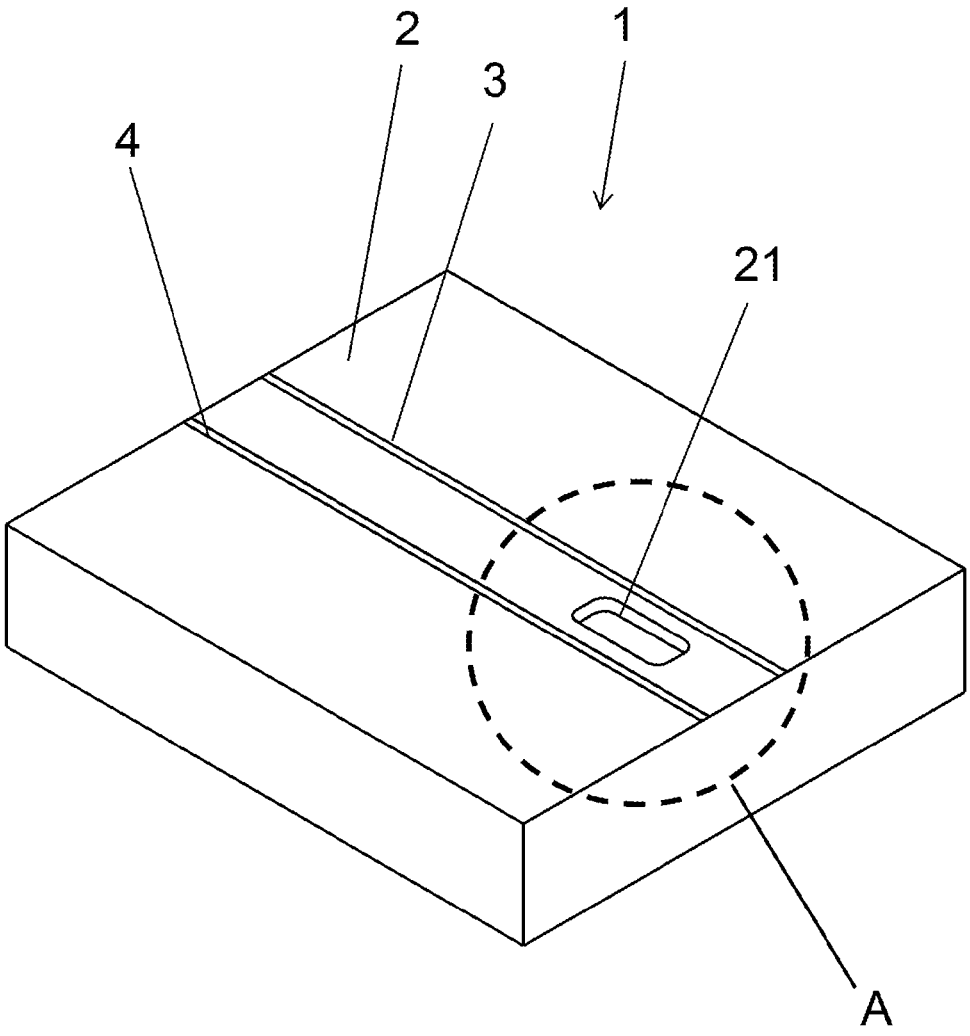
FIG. 1 is a perspective view of a high-frequency board according to an embodiment of the present invention.
Figure 2A:
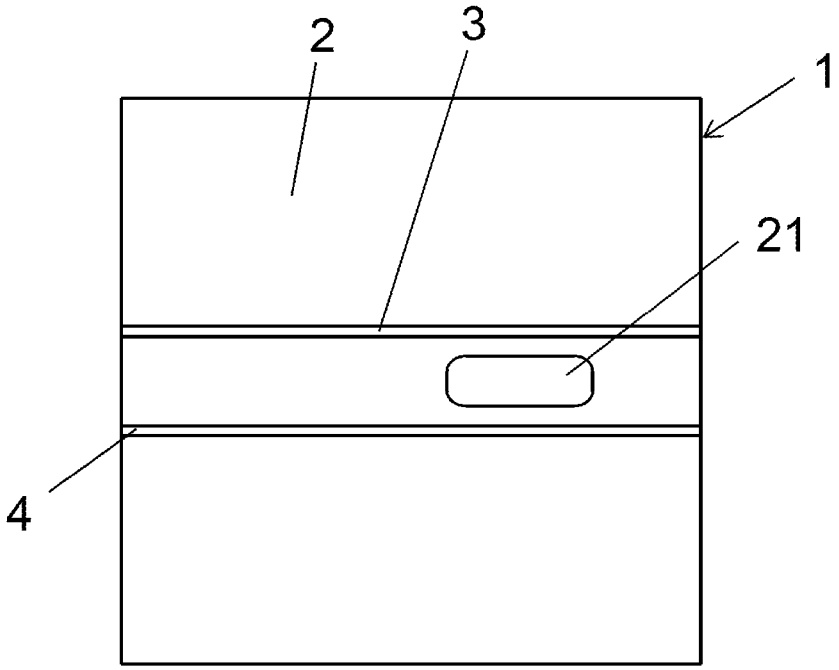
FIG. 2A is a plan view of the high-frequency board according to the embodiment of the present invention shown in FIG. 1.
Figure 2B:
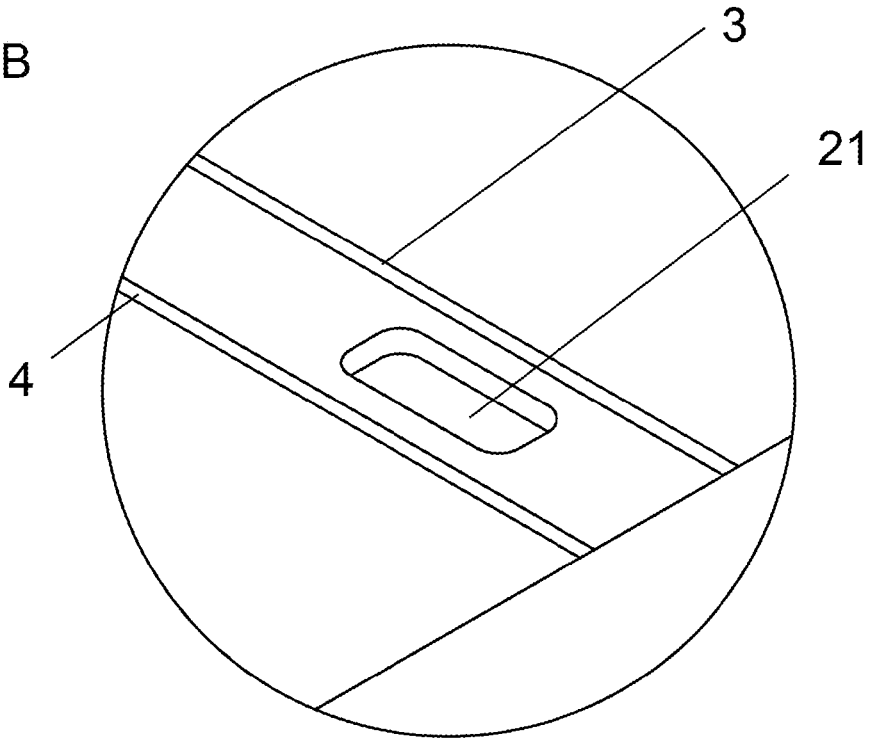
FIG. 2B is an enlarged perspective view of a portion A in FIG. 1.
Figure 11:
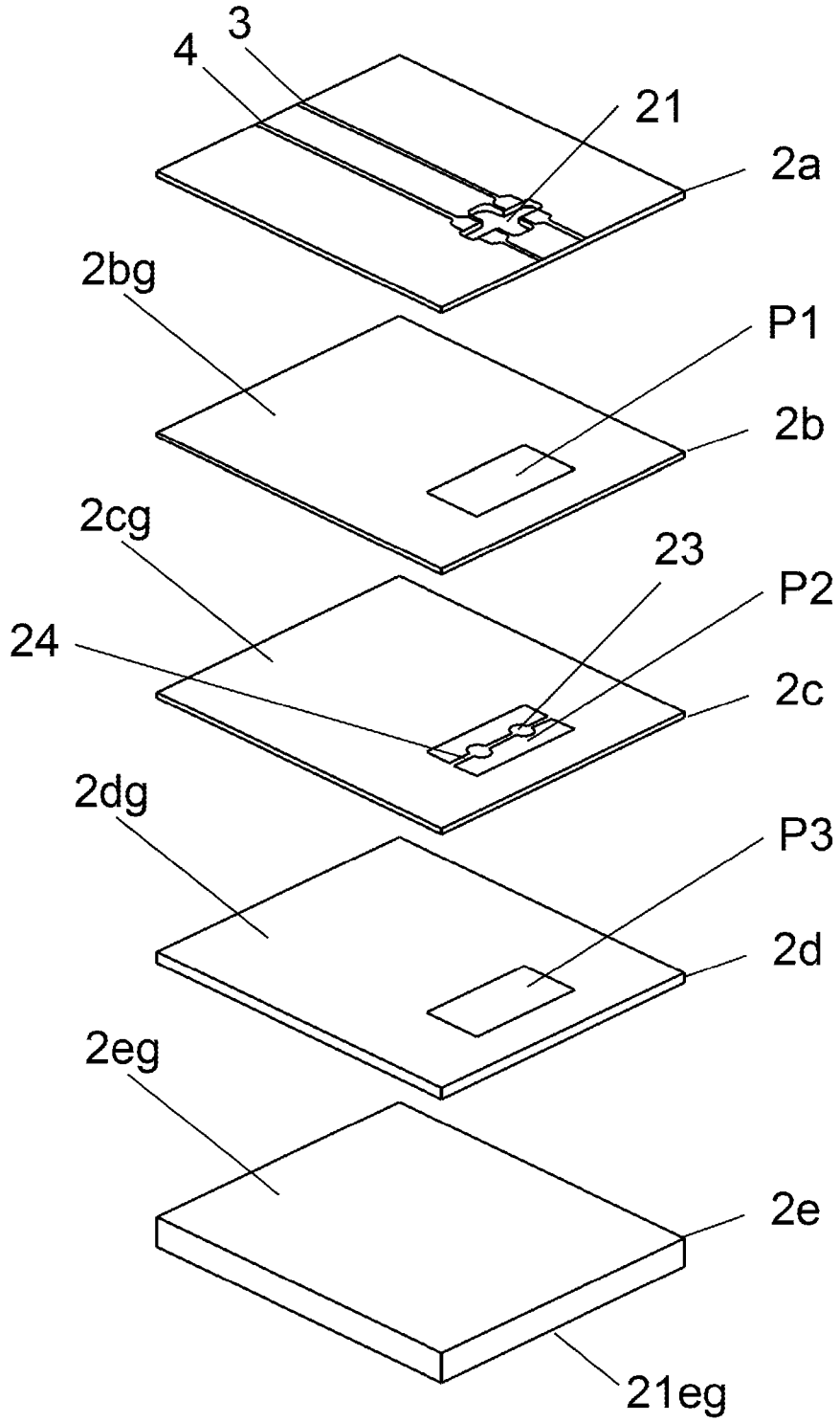
FIG. 11 is an exploded perspective view of a high-frequency board according to another embodiment of the present invention.
Figure 12A:
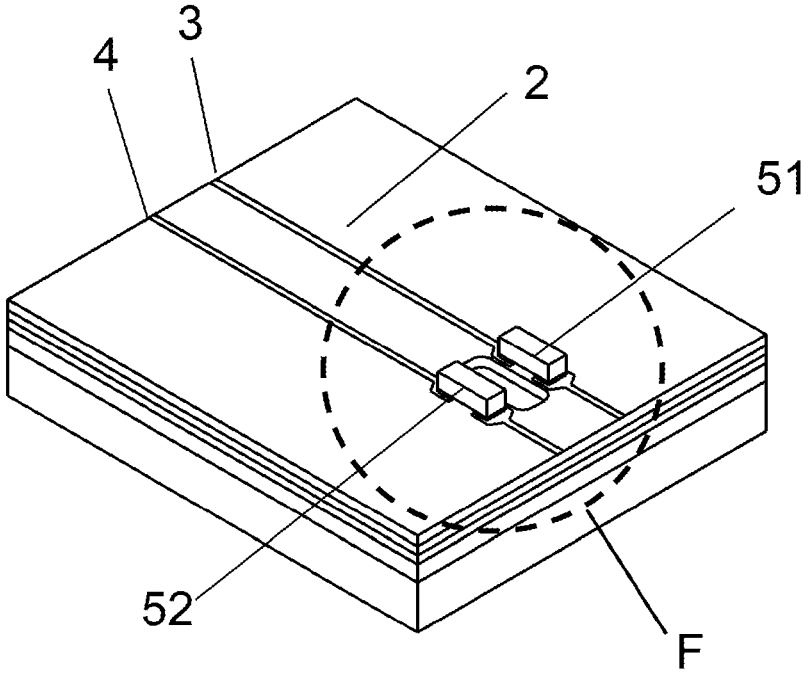
FIG. 12A is a perspective view of the high-frequency board according to another embodiment of the present invention.
Figure 12B:
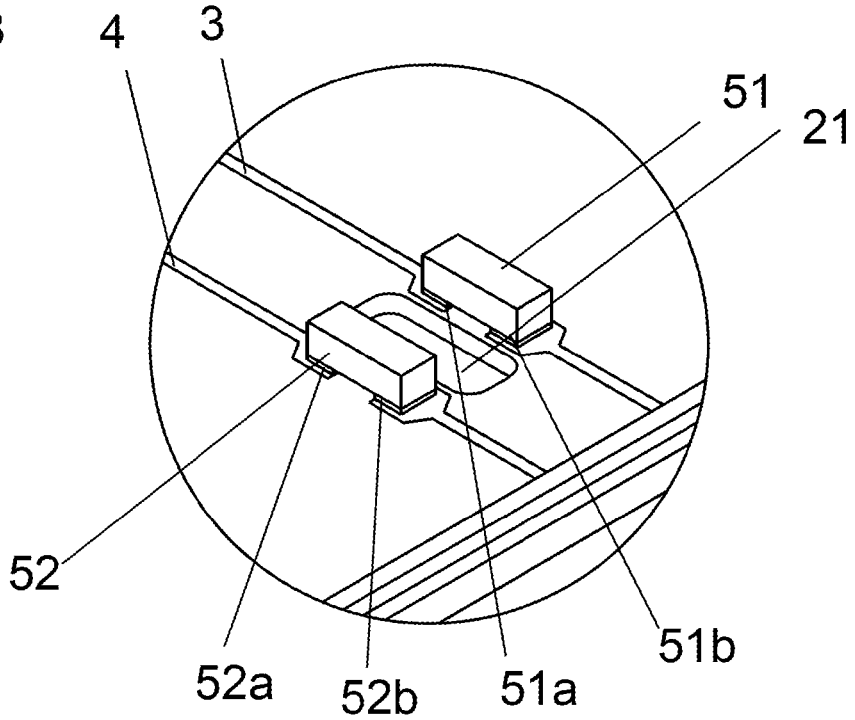
FIG. 12B is an enlarged perspective view of a portion F in FIG. 12A.
Figure 13A:
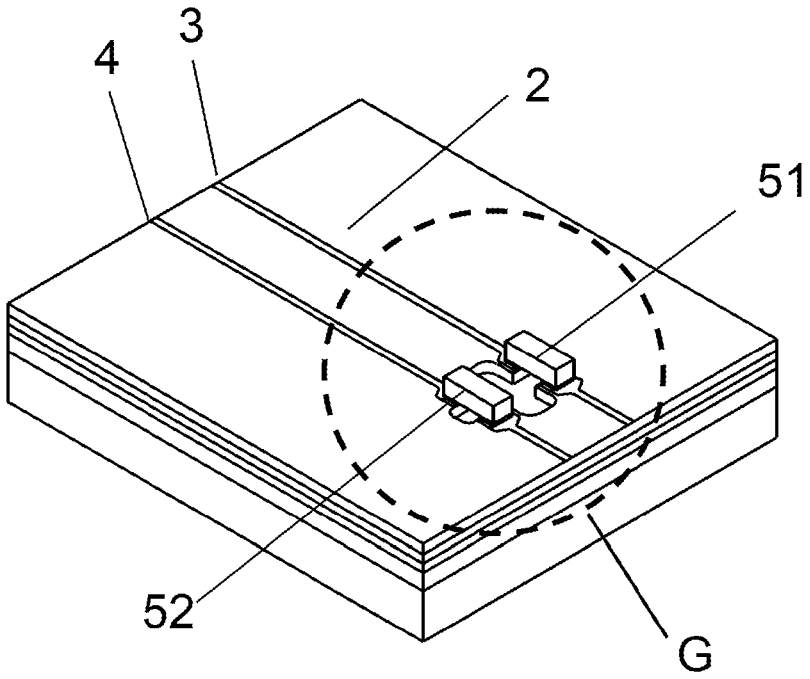
FIG. 13A is a perspective view of a high-frequency board according to another embodiment of the present invention.
Figure 13B:
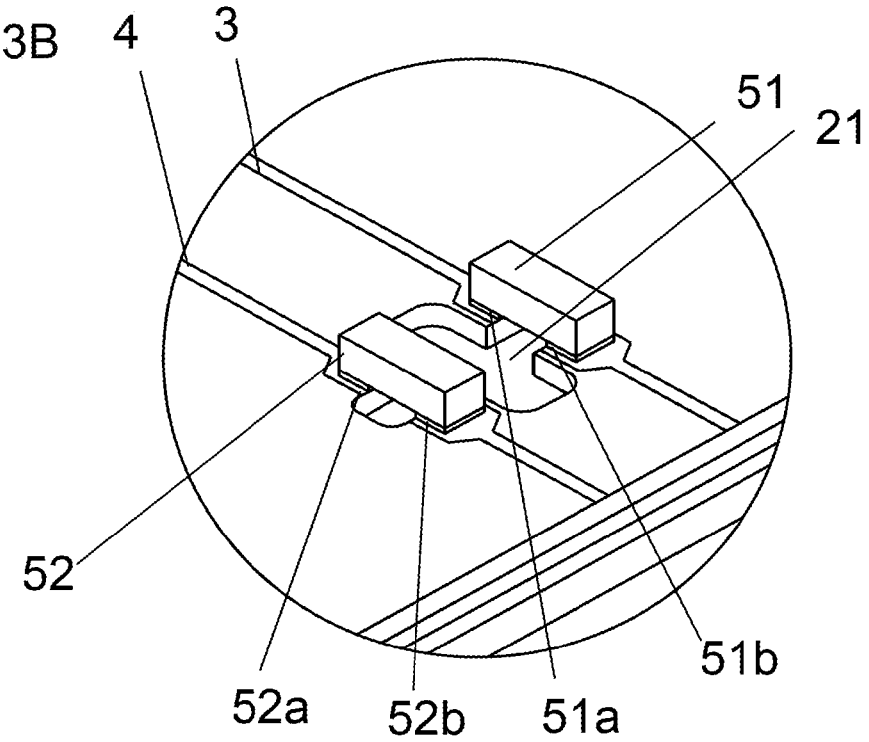
FIG. 13B is an enlarged perspective view of a portion Gin FIG. 13A.
Figure 14A:
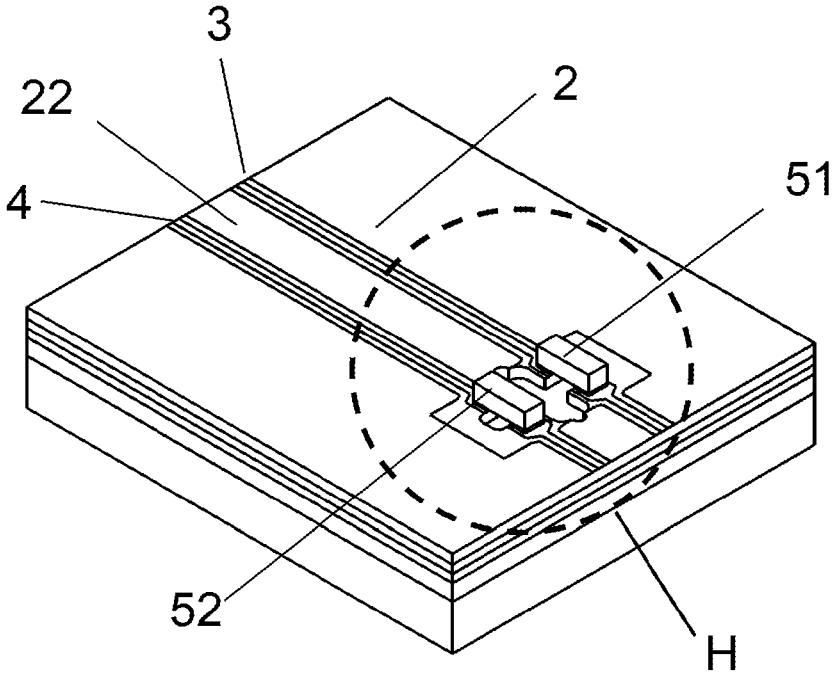
FIG. 14A is a perspective view of a high-frequency board according to another embodiment of the present invention.
Figure 14B:
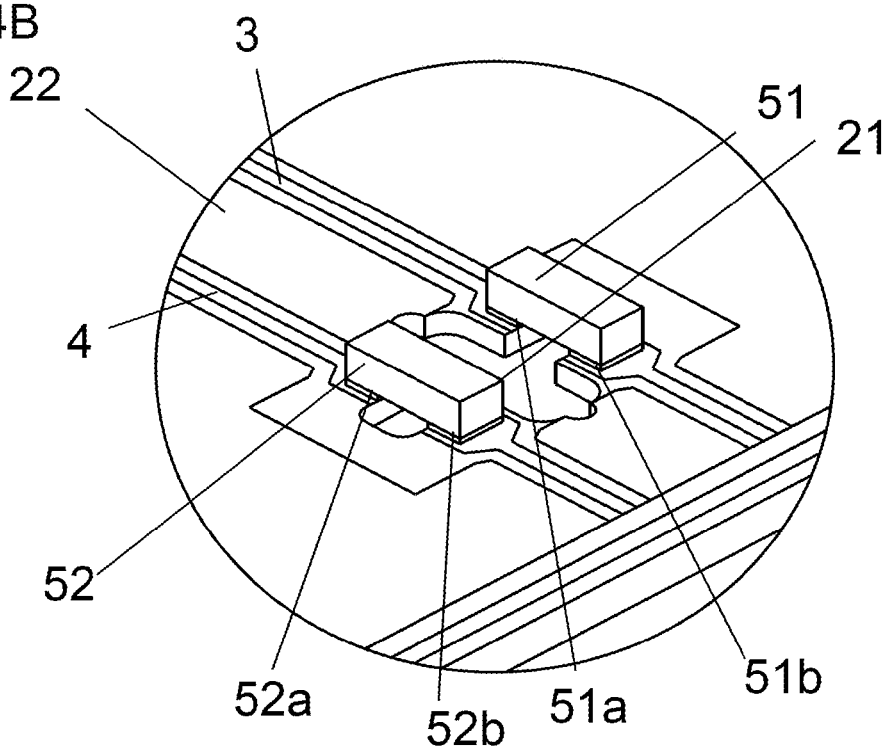
FIG. 14B is an enlarged perspective view of a portion H in FIG. 14A.
Figure 15:
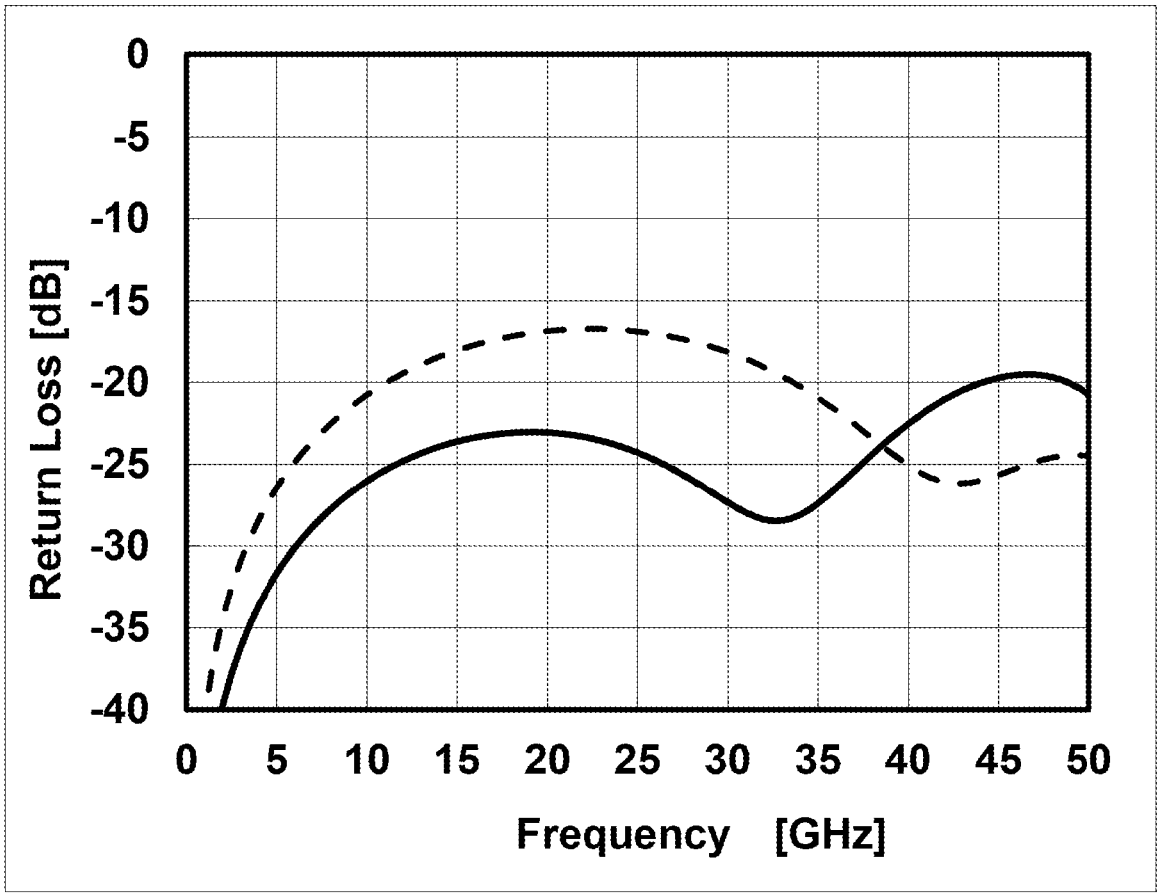
FIG. 15 is a graph showing the impedance of a high-frequency board according to another embodiment of the present invention.

FIG. 1 is a perspective view of a high-frequency board 1 according to an embodiment of the present invention. FIG. 2A is a plan view of the high-frequency board according to the embodiment of the present invention shown in FIG. 1, and FIG. 2B is an enlarged perspective view of a portion A in FIG. 1. FIGS. 3, 5, 7, and 9 are perspective views of high-frequency boards according to other embodiments of the present invention. FIGS. 4A, 6A, 8A, and 10A are plan views of the high-frequency boards shown in FIGS. 3, 5, 7, and 9, respectively. FIGS. 4B, 6B, 8B, and 10B are enlarged perspective views of the respective portion B in FIG. 3, portion C in FIG. 5, portion D in FIG. 7, and portion E in FIG. 9. FIG. 11 is an exploded perspective view of a high-frequency board according to another embodiment of the present invention. FIGS. 12A, 13A, and 14A are perspective views of the high-frequency boards according to other embodiments of the present invention. FIGS. 12B, 13B, and 14B are enlarged perspective views of the respective portion F in FIG. 12A, portion Gin FIG. 13A, and portion H in FIG. 14A. FIG. 15 is a graph showing the impedance of a high-frequency board according to another embodiment of the present invention. In each of these figures, the high-frequency board 1 includes an insulating substrate 2, a first line conductor 3, and a second line conductor 4.

The insulating substrate 2 is a laminate of insulating layers 2a, 2b, 2c, 2d, and 2e formed from dielectric substances. The insulating substrate 2 is, for example, rectangular as viewed from above, and has dimensions of 4×4 mm to 50×50 mm and a height of 1 to 10 mm. Each insulating layer in the insulating substrate 2 is formed from a dielectric material. Examples of the dielectric material include ceramic materials such as sintered aluminum oxide, sintered mullite, sintered silicon carbide, sintered aluminum nitride, and sintered silicon nitride, or glass ceramic materials.

The insulating substrate 2 has an upper surface with a recess 21 formed through the insulating layer 2a. The recess 21 is, for example, rectangular as viewed from above and has dimensions of 0.2×2 mm to 1×10 mm. As viewed from above, the recess 21 may also be elliptical or square, or may be rectangular but have round corners. The recess 21 is, for example, rectangular in a cross-sectional view and has dimensions of 0.2 to 2 mm in the direction parallel to the upper surface of the insulating substrate 2, and 0.2 to 2 mm in the direction perpendicular to the upper surface of the insulating substrate 2. In other words, the recess 21 has a depth of 0.2 to 2 mm. The recess 21 may be tapered, flared, or stepped in a cross-sectional view. The recess 21 is filled with air or a dielectric material such as resin or glass to have a lower dielectric constant than the insulating substrate 2.

The insulating layers 2b, 2c, and 2d have, on their upper surfaces, ground conductors 2bg, 2cg, and 2dg at positions around the recess 21 and at positions overlapping the first and second line conductors 3 and 4 as viewed from above. These ground conductors 2bg, 2cg, and 2dg are electrically connected vertically through, for example, vias. In FIG. 11, squares P1, P2, and P3 represent positions overlapping the recess 21, around which the ground conductors 2bg, 2cg, and 2dg are located. More specifically, the ground conductors 2bg, 2cg, and 2dg extend at positions excluding the squares P1, P2, and P3 overlapping the recess 21 as viewed from above. A ground conductor 2eg may be located on the upper surface of the insulating layer 2e. A lower-surface ground conductor layer 21eg may be located on the lower surface of the insulating substrate 2, or on the lower surface of the insulating layer 2e. The ground conductor 2eg or the lower-surface ground conductor layer 21eg are electrically connected to the ground conductors 2bg, 2cg, 2dg, and 2eg of the respective layers through vias.

The ground conductor 2eg or the lower-surface ground conductor layer 21eg may be located on, for example, the entire upper or lower surface of the insulating layer 2e, or may be located at the positions indicated by the squares P1, P2, and P3 overlapping the recess 21 as viewed from above. The squares P1, P2, and P3 overlapping the recess 21 as viewed from above, at which the ground conductors 2bg, 2cg, and 2dg are not located, each have dimensions of 0.2×0.2 mm to 20×20 mm. The ground conductors 2bg, 2cg, 2dg, and 2eg are formed from, for example, a metal material such as tungsten, molybdenum, or manganese. The lower-surface ground conductor layer 2eg is formed from, for example, a metal material such as tungsten, molybdenum, or manganese, and has its surface plated with nickel or gold.

As shown in FIGS. 1 to 2B, the first line conductor 3 extends on the upper surface of the insulating substrate 2, that is, on the upper surface of the insulating layer 2a to have a space from the recess 21. The first line conductor 3 is formed from, for example, a metal material such as gold, silver, copper, nickel, tungsten, molybdenum, or manganese, and may be formed on the surface of the insulating layer 2a as a metallization layer or a plated layer by co-firing or metal plating. The first line conductor 3 has a width of 0.05 to 2 mm, and a length of 4 to 50 mm.

The second line conductor 4 extends parallel to the first line conductor 3 on the upper surface of the insulating substrate 2, that is, on the upper surface of the insulating layer 2a to have a space from the recess 21. The second line conductor 4 is formed from, for example, a metal material such as gold, silver, copper, nickel, tungsten, molybdenum, or manganese, and may be formed on the surface of the insulating layer 2a as a metallization layer or a plated layer by co-firing or metal plating. The second line conductor 4 has a width of 0.05 to 2 mm, and a length of 4 to 50 mm.

The high-frequency board 1 according to the present embodiment has a space defined by the recess 21 between the first and second line conductors 3 and 4. This space reduces the dielectric constant between the first and second line conductors 3 and 4. The smaller space between the first and second line conductors 3 and 4 increases the electrostatic capacity. This structure can thus easily increase the characteristic impedance, which can otherwise easily decrease below an intended value, allowing the characteristic impedance to be an intended value. The high-frequency board 1 can thus easily adjust the characteristic impedance between the first and second line conductors 3 and 4 to an intended value, and improve the high-frequency characteristics of the first and second line conductors 3 and 4 to which the high-frequency signals are transmitted.

As shown in FIGS. 3 to 14B, the first and second line conductors 3 and 4 may each include a separator in the middle. In this case, the separators include first electrode pads 32 and second electrode pads 42, which are connected electrically to capacitors.

Figure 3:
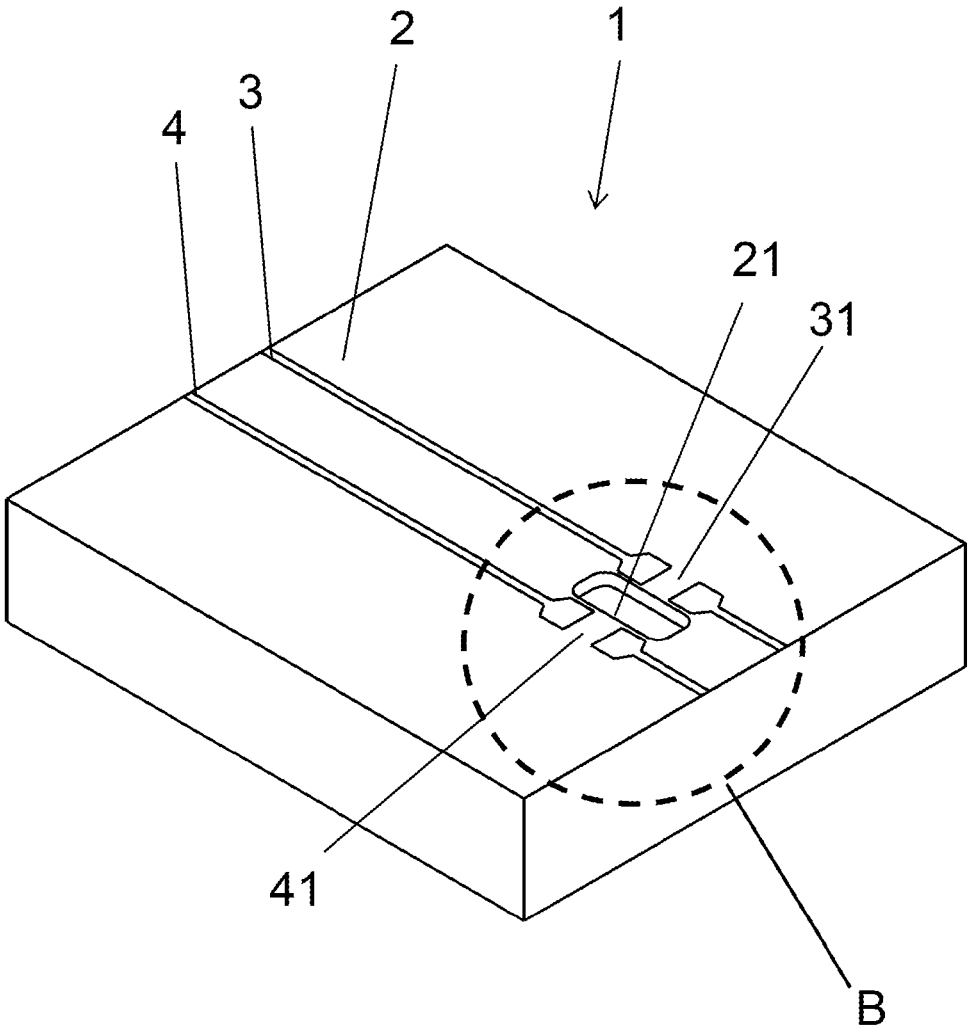
FIG. 3 is a perspective view of a high-frequency board according to another embodiment of the present invention.
Figure 4A:
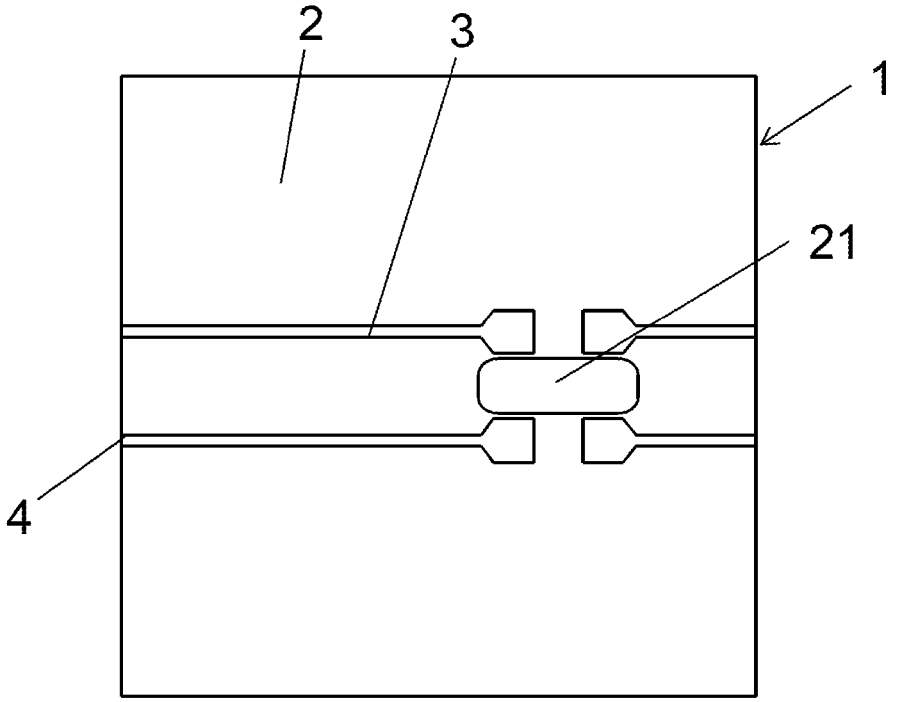
FIG. 4A is a plan view of the high-frequency board according to the other embodiment of the present invention shown in FIG. 3.
Figure 4B:
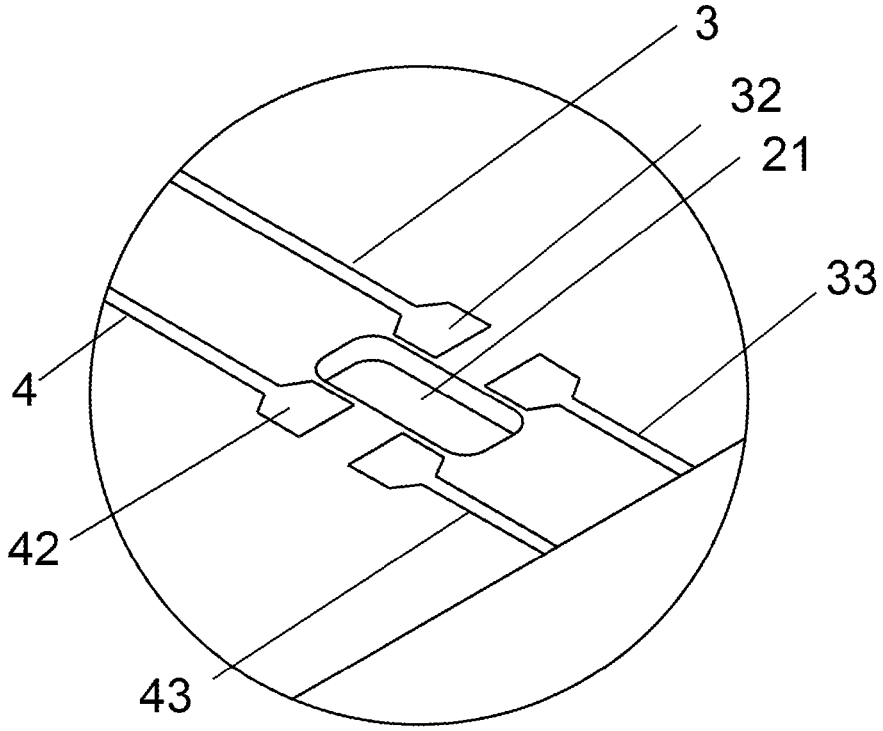
FIG. 4B is an enlarged perspective view of a portion B in FIG. 3.
Figure 5:
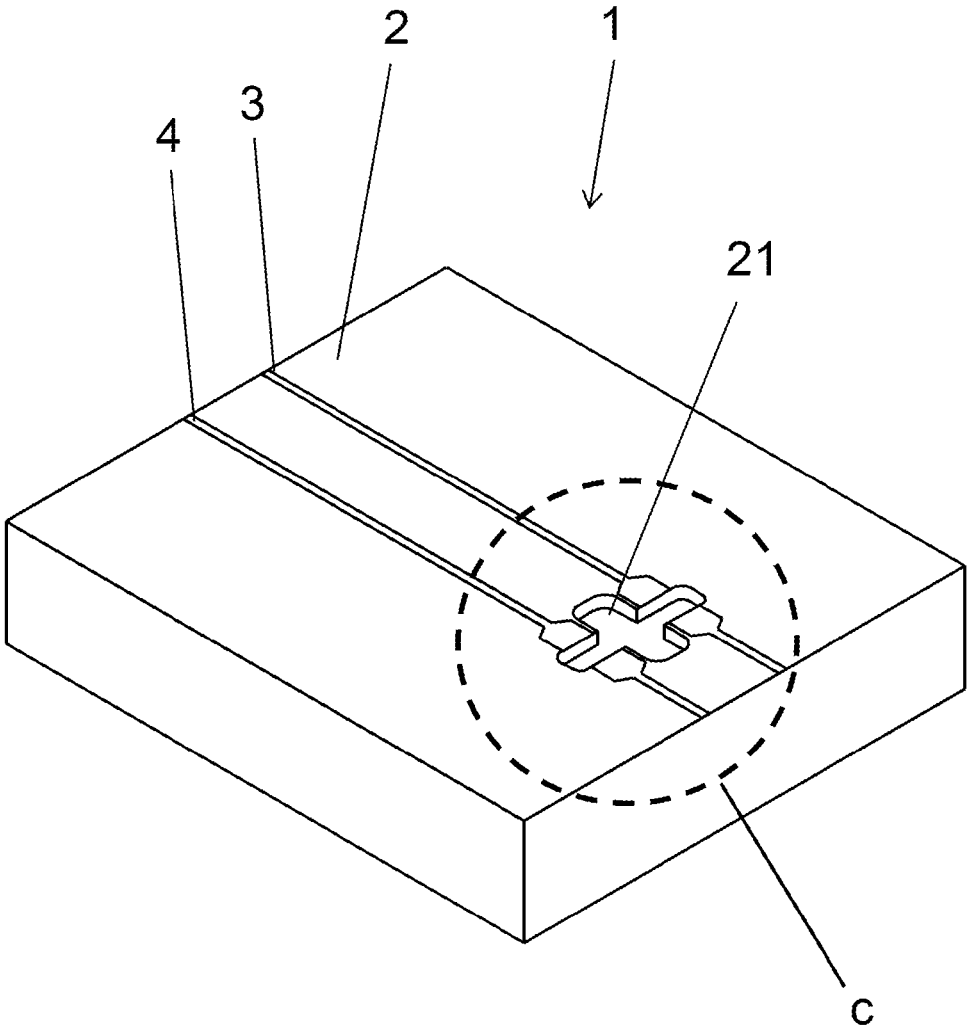
FIG. 5 is a perspective view of a high-frequency board according to another embodiment of the present invention.
Figure 6A:
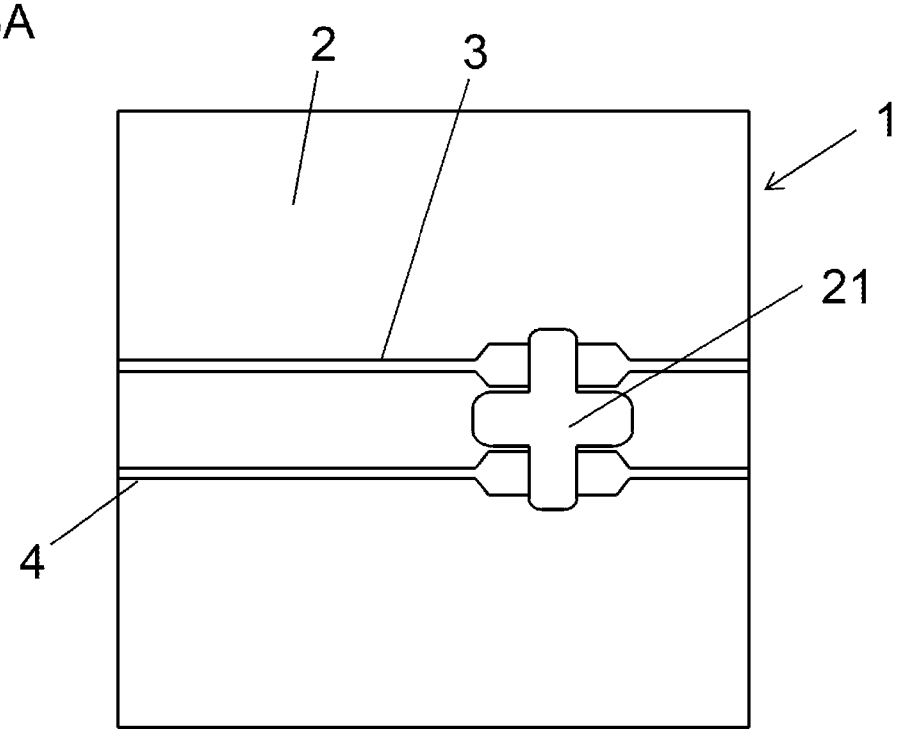
FIG. 6A is a plan view of the high-frequency board according to the other embodiment of the present invention shown in FIG. 5.
Figure 6B:
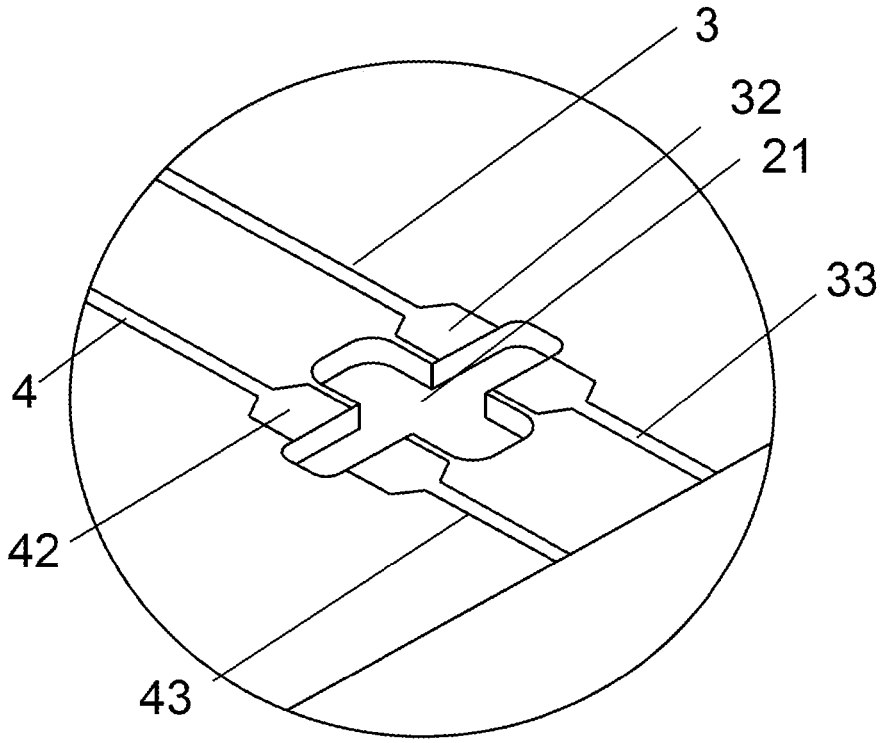
FIG. 6B is an enlarged perspective view of a portion C in FIG. 5.
Figure 7:
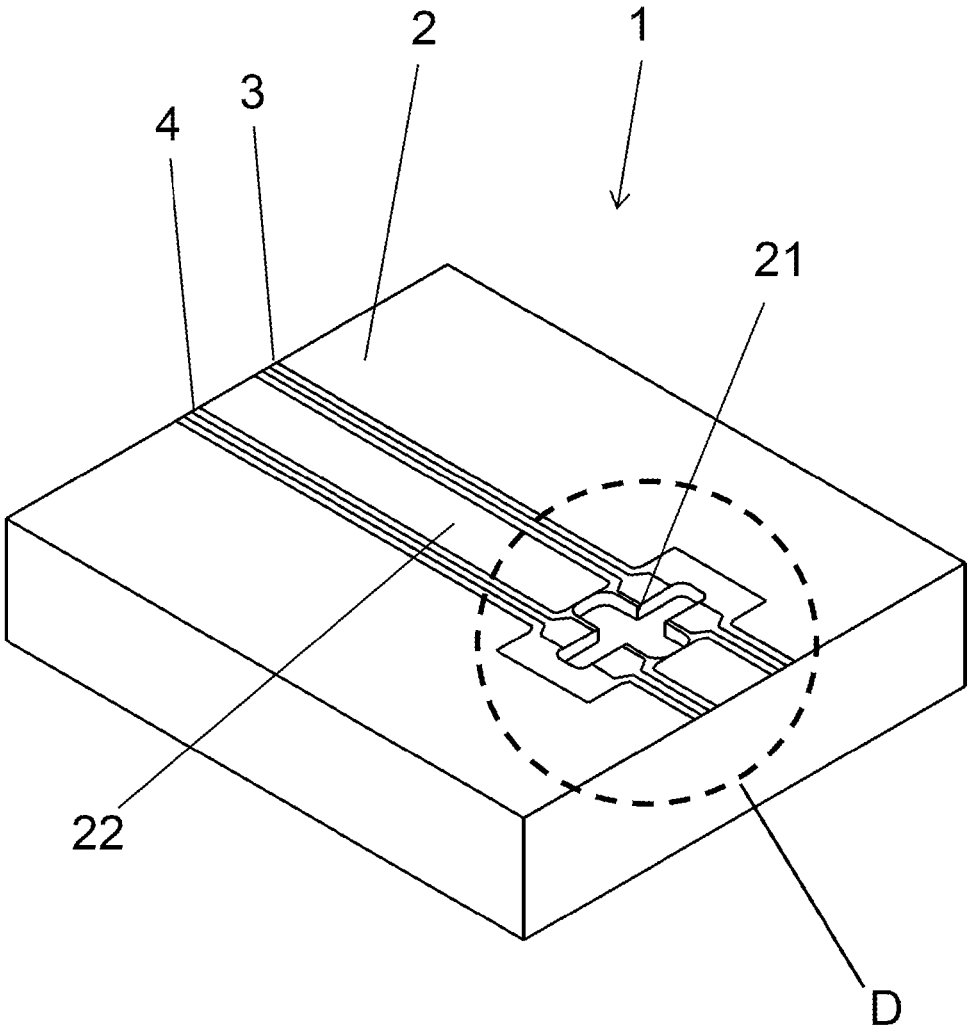
FIG. 7 is a perspective view of a high-frequency board according to another embodiment of the present invention.
Figure 8A:
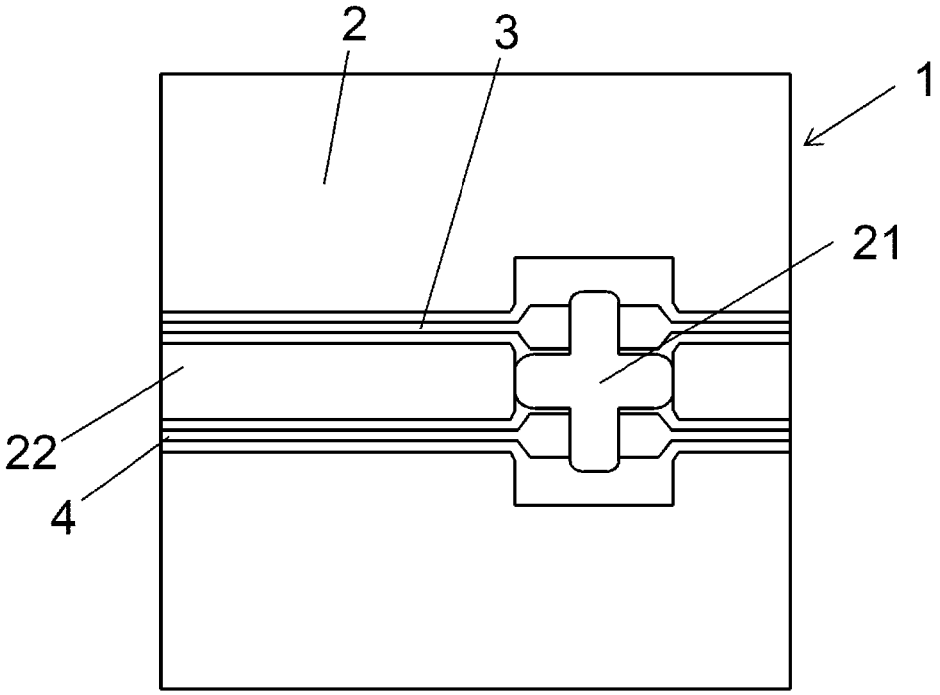
FIG. 8A is a plan view of the high-frequency board according to the other embodiment of the present invention shown in FIG. 7.
Figure 8B:
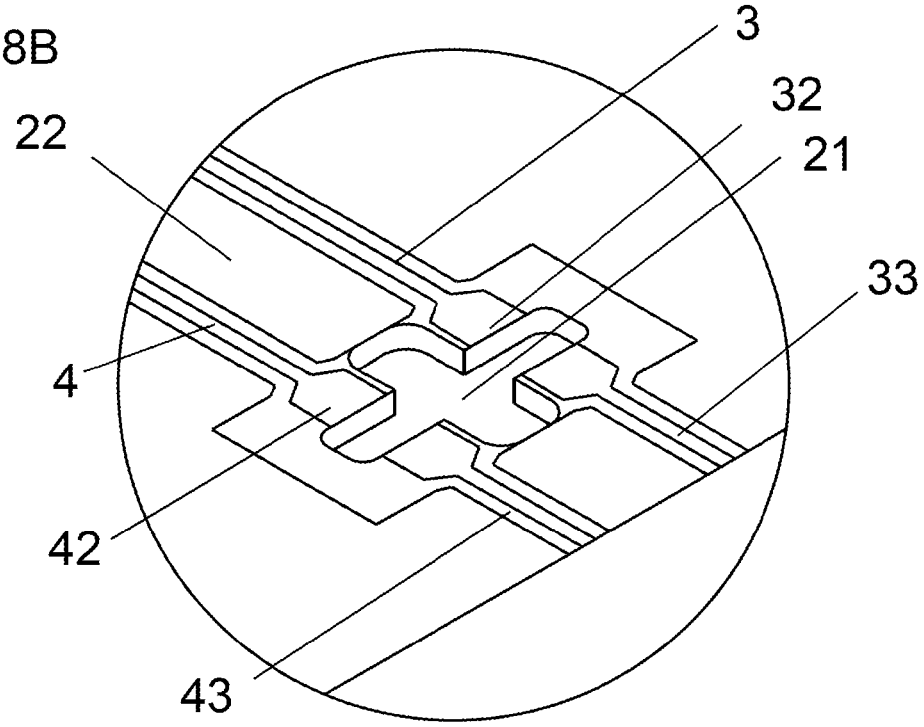
FIG. 8B is an enlarged perspective view of a portion D in FIG. 7.

As shown in FIGS. 3 to 4B, the first line conductor 3 may include a first separator 31, which separates the line conductor in the middle. In this case, the first line conductor 3 includes first electrode pads 32, which are connected to a first electrode 51a and a second electrode 51b of a first capacitor 51, and first lines 33, which extend from the first electrode pads 32. As viewed from above, for example, each first electrode pad 32 has a length of 0.2 to 2 mm, and a width of 0.2 to 2 mm. Each first line 33 has a length of 1.5 to 25 mm, and a width of 0.05 to 2 mm. The first electrode pads 32 and the first lines 33 both have a thickness of 0.01 to 0.1 mm.

As viewed from above, the first electrode pads 32 are at positions overlapping at least the ground conductor 2eg or the lower-surface ground conductor layer 21eg, and the squares P1, P2, and P3 at which no ground conductors 2bg, 2cg, and 2dg are located. The first lines 33 are also at positions overlapping at least the ground conductor 2bg as viewed from above. The first electrode pads 32 and the first lines 33, and the ground conductor 2eg or the lower-surface ground conductor layer and the ground conductor 2bg form a strip line structure. The high-frequency board 1 according to the present embodiment thus facilitates transmission of high-frequency signals.

The first electrode pads 32 and the first lines 33 may be formed from, for example, a metal material such as gold, silver, copper, nickel, tungsten, molybdenum, or manganese, and may be formed on the upper surface of the insulating layer 2a as metallization layers or plated layers by co-firing or metal plating.

As shown in FIGS. 3 to 4B, the second line conductor 4 may include a second separator 41, which separates the line conductor in the middle. In this case, the second line conductor 4 includes second electrode pads 42, which are connected to a first electrode 52a and a second electrode 52b of a second capacitor 52, and second lines 43, which extend from the second electrode pads 42. The second electrode pads 42 face the first electrode pads 32 across the recess 21 as viewed from above. As viewed from above, for example, the second electrode pads 42 have a length of 0.2 to 2 mm, and a width of 0.2 to 2 mm, and the second lines 43 have a length of 1.5 to 25 mm, and a width of 0.05 to 2 mm. The second electrode pads 42 and the second lines 43 both have a thickness of 0.01 to 0.1 mm. The second electrode pads 42 and the second lines 43 are formed from, for example, a metal material such as gold, silver, copper, nickel, tungsten, molybdenum, or manganese, and may be formed on the upper surface of the insulating layer 2a as metallization layers or plated layers by co-firing, or metal plating.

As viewed from above, the second electrode pads 42 are at positions overlapping at least the ground conductor 2eg or the lower-surface ground conductor layer 21eg, and the squares P1, P2, and P3, at which no ground conductors 2bg, 2cg, and 2dg are located. As viewed from above, the second lines 43 are also at positions overlapping at least the ground conductor 2bg. The second electrode pads 42 and the second lines 43, and the ground conductor 2eg or the lower-surface ground conductor layer and the ground conductor 2bg form a strip line structure. The high-frequency board 1 according to the present embodiment thus facilitates transmission of high-frequency signals.

The electrodes are located on the lower surfaces of the first and second capacitors 51 and 52. The electrodes are electrically connected and bonded to the first and second capacitors 51 and 52 with a bond. The bond may be one of various types of solder such as Sn—Ag—Cu solder, Sn—Zn—Bi solder, or Sn—Cu solder.

The high-frequency board 1 includes the first and second capacitors 51 and 52 overlapping the first and second separators 31 and 41 in middle portions of the first and second line conductors 3 and 4. The first capacitor 51 is electrically connected and fixed to the first electrode pads 32 with a bond. The second capacitor 52 is electrically connected and fixed to the second electrode pads 42 with a bond. The first and second capacitors 51 and 52 are, for example, rectangular as viewed from above, and have dimensions of 0.3×0.4 mm to 2×4 mm and a height of 0.3 to 2 mm. The first and second capacitors 51 and 52 are formed from, for example, forsterite, aluminum oxide, barium magnesium niobate, or barium neodymium titanate. The first and second capacitors 51 and 52 are located on the first and second separators 31 and 41 across the first and second electrode pads 32 and 42 and electrically connected and fixed to the first and second line conductors 3 and 4 to remove the direct-current (DC) voltage component from high-frequency signals.

The first and second line conductors 3 and 4 arranged closer to each other to downsize the high-frequency board 1 may decrease the impedance. To prevent the impedance from decreasing, the recess 21 is formed between the first and second line conductors 3 and 42. The recess allows the first and second line conductors 3 and 4 to be closer to downsize the high-frequency board 1 as compared with the structure without the recess 21.

The recess 21 extends parallel to the first and second lined 33 and 43 across the ends of the first electrode pads 32 to which the first line conductors 3 are connected, and the ends of the second electrode pads 42 to which the second line conductors 4 are connected. This structure can further reduce the dielectric constant between the first and second electrode pads 32 and 42, and thus can further increase the impedance between the first and second electrode pads 32 and 42.

As shown in FIGS. 5 to 8B, the first and second separators 31 and 41 may be recessed. More specifically, a groove continuous with the recess 21 may be formed between the first electrode pads 32 and between the second electrode pads 42. The recess 21 may be in the shape of a cross. In other words, the recess 21 may continuously extend across the first and second separators 31 and 42, and between the first and second line conductors 3 and 4.

Figure 9:
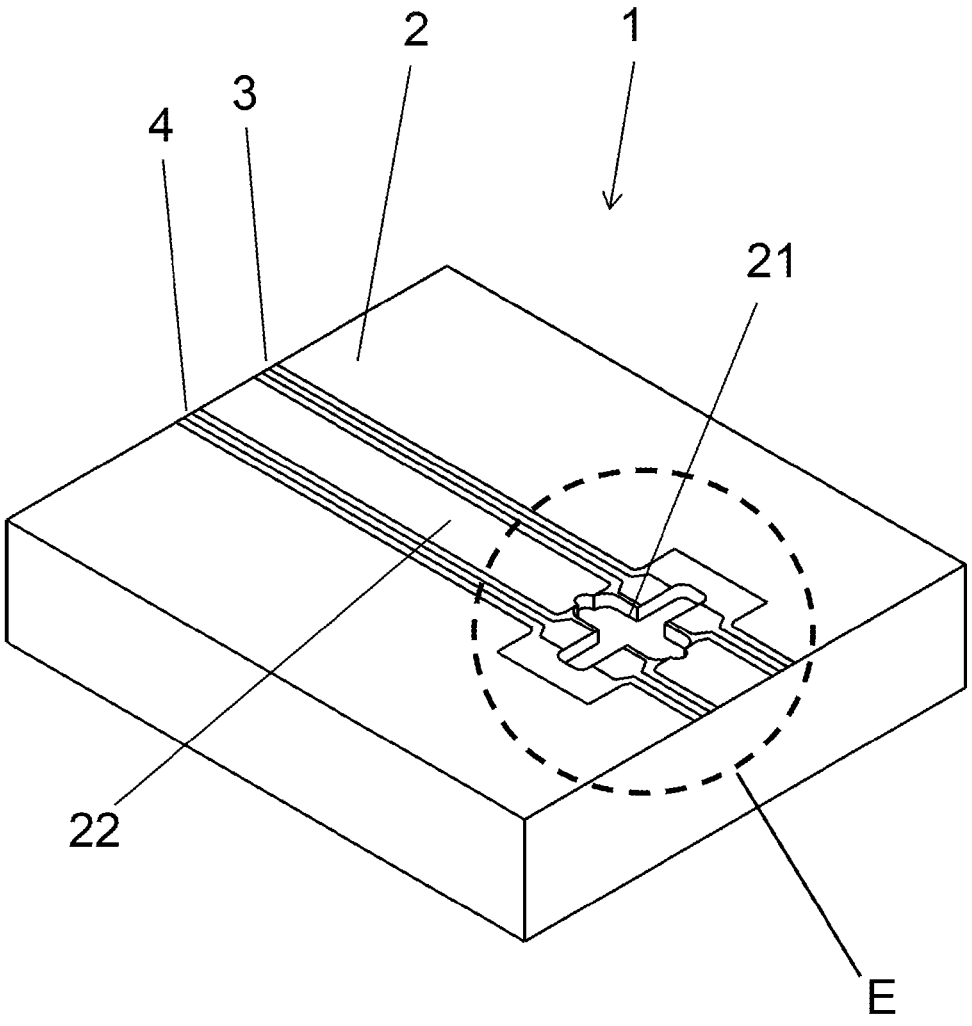
FIG. 9 is a perspective view of a high-frequency board according to another embodiment of the present invention.
Figure 10A:
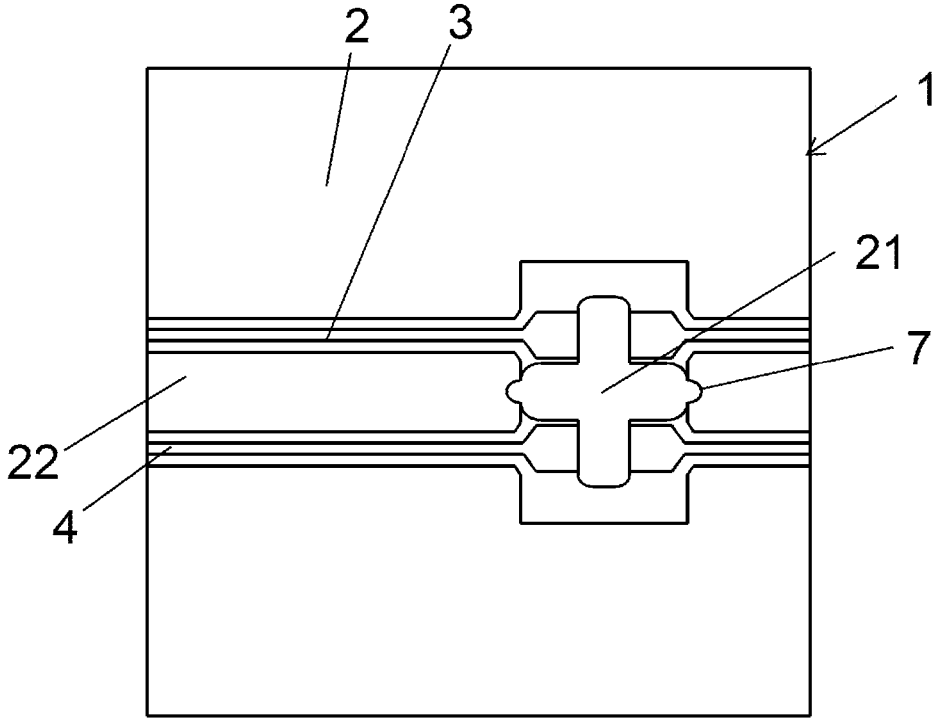
FIG. 10A is a plan view of the high-frequency board according to another embodiment of the present invention shown in FIG. 9.
Figure 10B:
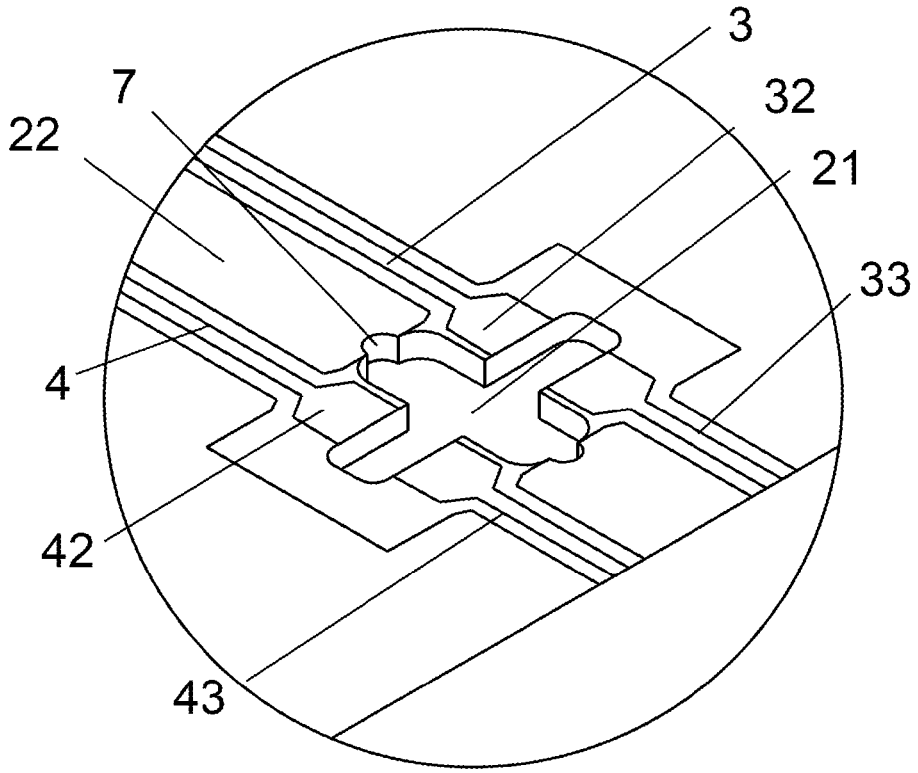
FIG. 10B is an enlarged perspective view of a portion E in FIG. 9.

As shown in FIGS. 9 to 10B, the recess 21 may have notches 7 in end side walls each located between the first and second electrode pads 32 and 42. The notches 7 can increase the impedance between the first and second line conductors 3 and 4.

The notches 7 may have their surfaces covered with metallization layers 71. The metallization layers 71 are formed from, for example, tungsten, molybdenum, manganese, nickel, or gold. The metallization layers 71 regulate the electric field at the boundary between the atmosphere layer defined by the recess 21 and the dielectric material formed from the insulating substrate 2, at the ends of the first electrode pads 32 to which the first line conductors 3 are connected and the ends of the second electrode pads 42 to which the second line conductors 4 are connected. The metallization layers 71 also regulate crosstalk or resonance between the first and second line conductors 3 and 4, thus improving the frequency characteristics of the high-frequency board 1.

As shown in FIG. 11, internal ground conductor layers 23, which are electrically connected to the ground conductor 2cg through connecting line conductors 24, are in the insulating substrate 2, or more specifically, on the upper surface of the insulating layer 2c. The internal ground conductor layers 23 are, for example, elliptical as viewed from above, and are partly electrically connected to the surrounding ground conductor 2cg through the connecting line conductors 24. The elliptical areas each have dimensions of 0.3×0.4 mm to 2×8 mm. The internal ground conductor layers 23 may be shaped partly circular and rectangular. The internal ground conductor layers 23 and the connecting line conductors 24 are formed from, for example, a metal material such as tungsten, molybdenum, or manganese, and may be formed on the upper surface of the insulating layer 2c as metallization layers by co-firing. In particular, the internal ground conductor layers 23 with curved edges like an ellipse as viewed from above can reduce drastic changes in impedance between the first and second electrode pads 32 and 42 than the internal ground conductor layers 23 that are rectangular as viewed from above. This reduces insertion loss or return loss during transmission of high-frequency signals between the first and second electrode pads 32 and 42.

As shown in FIG. 11, the internal ground conductor layers 23 are at positions overlapping the recess 21 between the first and second electrode pads 32 and 42 as viewed from above. This structure further strengthens the electric field coupling between the capacitors, such as the first and second capacitors 51 and 52 and the ground conductors located around the capacitors when high-frequency signals are transmitted through the first and second capacitors 51 and 52 than the structure without the internal ground conductor layers 23, thus reducing crosstalk or resonance possibly caused when the electric field distribution increases more than intended during transmission of high-frequency signals. Thus, the internal ground conductor layers 23 improve the frequency characteristics of the high-frequency board 1. The first and second line conductors 3 and 4 can smoothly transmit high-frequency signals through the capacitors.

The internal ground conductor layers 23 have outer peripheries at positions overlapping the first and second electrode pads 32 and 42 as viewed from above. As the same advantageous effect is described above, this structure can strengthen the electric field coupling between the first and second electrode pads 32 and 42 and the ground conductors arranged around the first and second electrode pads 32 and 42 and the capacitors when high-frequency signals are transmitted through the first and second electrode pads 32 and 42 and the capacitors. The internal ground conductor layers 23 can thus reduce crosstalk or resonance possibly caused when the electric field distribution increases more than intended during transmission of high-frequency signals. The first and second line conductors 3 and 4 can smoothly transmit high-frequency signals through the capacitors and the first and second electrode pads 32 and 42.

As shown in FIG. 11, the internal ground conductor layers 23 are electrically connected to the ground conductor 2cg through the connecting line conductors 24. Further, for example, the ground conductors 2bg, 2cg, 2dg, and 2eg located on the upper surfaces of the insulating layers 2b, 2c, 2d, and 2e may be electrically connected through, for example, vias formed vertically through the insulating layers 2b, 2c, 2d, and 2e.

Ground conductor layers 22 are located on the upper surface of the insulating layer 2a. The ground conductor layers 22 are located on both sides of the first and second line conductors 3 and 4 and between the first and second line conductors 3 and 4, forming a coplanar line. This structure can strengthen the electric field coupling between the first and second line conductors 3 and 4 and the ground conductor layers 22 serving as a reference potential even more than the strip line structure. Thus, the high-frequency board 1 reduces expansion of the electric field, which can be caused during transmission of high-frequency signals through the first and second line conductors 3 and 4, and facilitates transmission of high-frequency signals through the first and second line conductors 3 and 4.

The graph in FIG. 15 experimentally shows the adjustment of the characteristic impedance. The graph shows the return loss with respect to the frequency for comparison between the structures with and without the recess 21 and the notches 7. The recess 21 in the shape of a recess extends continuously between the first electrode pads 32 and the second electrode pads 42, between the first electrode pads 32, and between the second electrode pads 42. In the graph, the horizontal axis indicates the frequency, and the vertical axis indicates the return loss of transmitted signals. The broken line shows the results for the structure without the recess 21 and the notches 7 on the upper surface of the insulating substrate 2. The solid line shows the results for the structure with the recess 21 and the notches 7 on the upper surface of the insulating substrate 2. For example, the graph in FIG. 15 shows that the return loss of transmitted signals with frequencies up to 40 GHz is lower than or equal to −20 dB for the structure including the recess 21 and the notches 7 on the upper surface of the insulating substrate 2, and exceeds −20 dB for the structure without the recess 21 and the notches 7. This reveals that the structure with the recess 21 and the notches 7 can adjust the characteristic impedance on the transmission lines for high-frequency signals to an intended value and can reduce the return loss on the transmission lines.

Method for Manufacturing High-Frequency Board

The insulating substrate 2 including the insulating layers 2a, 2b, 2c, 2d, and 2e formed from, for example, sintered aluminum oxide may be prepared in the manner described below. An aluminum oxide-containing powdery raw material and a silicon oxide-containing powdery raw material are mixed with, for example, an appropriate organic binder and an appropriate solvent to form slurry. The slurry is then shaped into sheets with, for example, a doctor blade method. Multiple ceramic green sheets are prepared. A ceramic green sheet to be the uppermost sheet has a through-hole to be the recess 21.

The ceramic green sheets are then stacked one on another and pressure-bonded. The stacked ceramic green sheets are then fired at a temperature of about 1600° C. in a reducing atmosphere, and cut or punched into an appropriate shape to complete the insulating substrate 2 with an intended shape.

The first electrode pads 32, the first lines 33, the second electrode pads 42, the second lines 43, the ground conductor layers 22, the internal ground conductor layers 23, the connecting line conductors 24, the ground conductors 2bg, 2cg, 2dg, and 2eg on the upper surfaces of the layers, and the lower-surface ground conductor layer 21eg are formed from, for example, metallization layers, which may be formed from a metal having a high melting point, such as tungsten, molybdenum, or manganese, prepared in the manner described below. A metal powder with a high melting point is kneaded with an organic solvent and a binder fully into a metal paste. The metal paste is then printed at predetermined positions on the ceramic green sheets, to be the upper or lower surfaces of the insulating layers 2a, 2b, 2c, 2d, and 2e, by, for example, screen printing. These ceramic green sheets with a printed metal paste are stacked one on another, pressure-bonded, and then co-fired. Through these processes, the metallization layers are applied to the upper surface and the interior of the insulating substrate 2 or between the insulating layers to be the first electrode pads 32, the first lines 33, the second electrode pads 42, the second lines 43, the ground conductor layers 22, the internal ground conductor layers 23, the connecting line conductors 24, the ground conductors 2bg, 2cg, 2dg, and 2eg on the upper surfaces of the insulating layers, and the lower-surface ground conductor layer 21eg on the lower surface of the insulating layer 2e. The first electrode pads 32, the first lines 33, the second electrode pads 42, the second lines 43, the ground conductor layers 22, and the lower-surface ground conductor layer 21eg may have their surfaces plated with nickel or gold. The plated surfaces of these metal layers enhance the wettability of a bond such as a brazing material or solder to improve the joint between a base 8 and the capacitors and improve corrosion or weather resistance.

The vias may be formed by, for example, first forming through-holes in the ceramic green sheets to be the insulating layers 2a, 2b, 2c, 2d, and 2e, and filling the through-holes with the same metal paste as for the ground conductor layers 22, the internal ground conductor layers 23, the connecting line conductors 24, the ground conductors 2bg, 2cg, 2dg, and 2eg on the upper surfaces of the insulating layers, and the lower-surface ground conductor layer 21eg on the lower surface of the insulating layer 2e. The ceramic green sheets are stacked one on another, pressure-bonded, and then co-fired. The through-holes can be formed by, for example, die machining using a metal pin, or punching, for example, with laser light. The metal paste may be easily placed into the through-holes using, for example, vacuum suction.

Structure of High-Frequency Package

Figure 16:
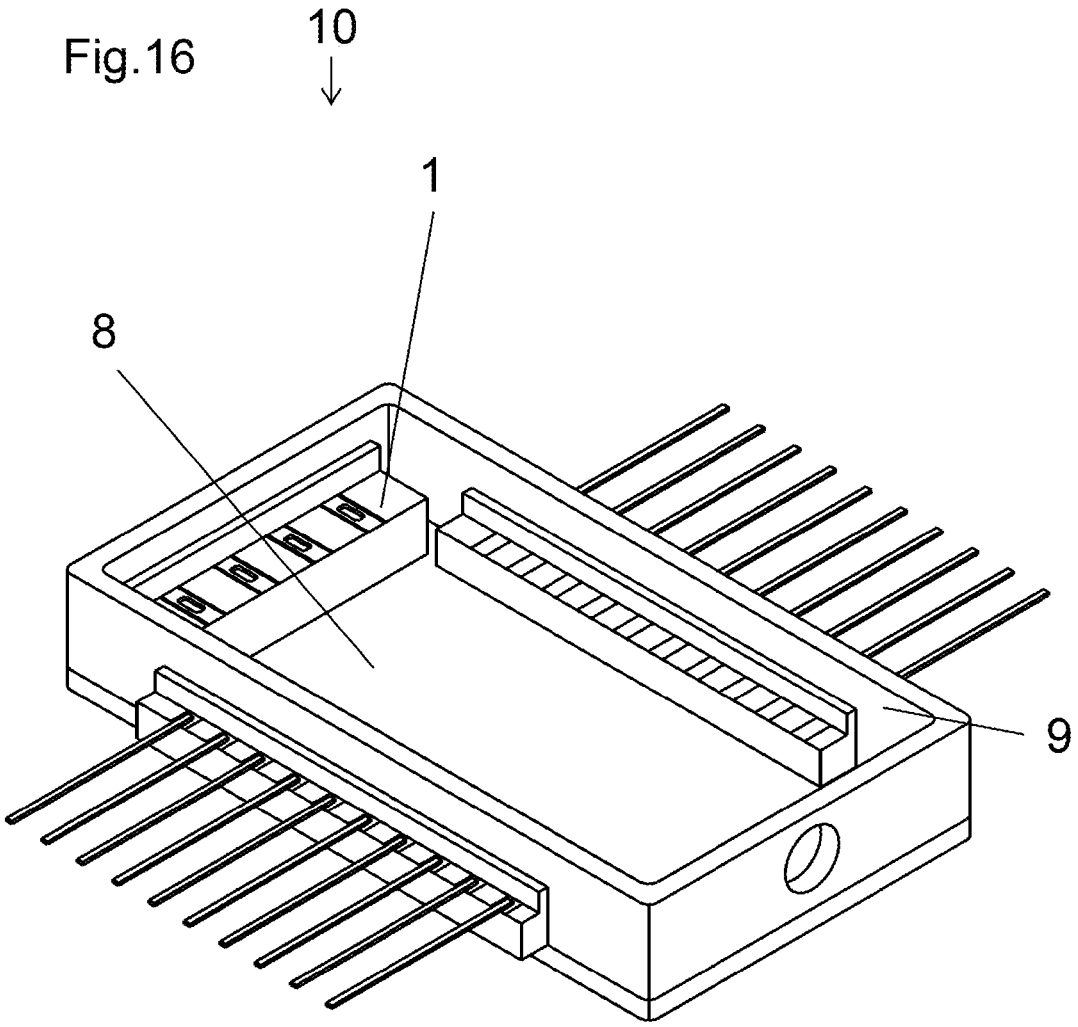
FIG. 16 is a perspective view of a high-frequency package according to an embodiment of the present invention.
Figure 17:
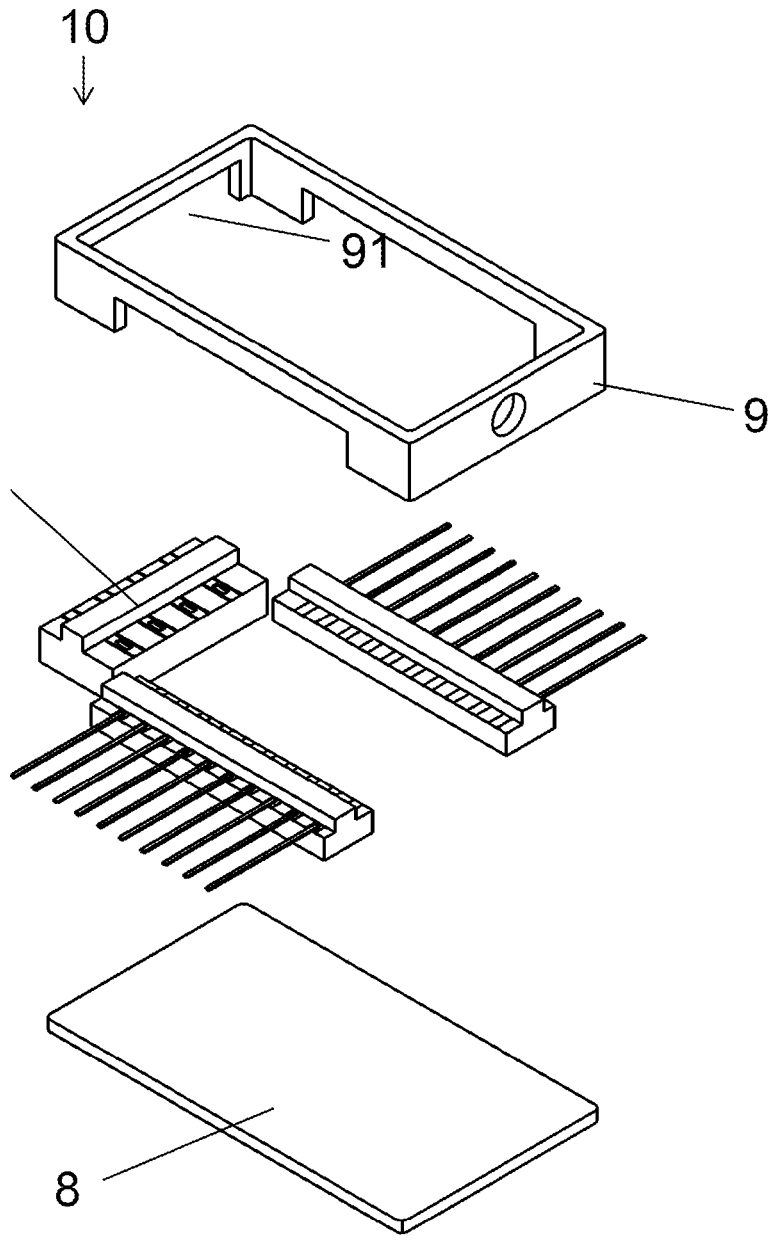
FIG. 17 is an exploded perspective view of the high-frequency package according to the embodiment of the present invention.

FIG. 16 is a perspective view of a high-frequency package 10 according to an embodiment of the present invention. FIG. 17 is an exploded perspective view of the high-frequency package 10 according to the embodiment of the present invention. In these figures, the high-frequency package 10 includes the base 8, a frame 9, and the high-frequency board 1 according to the embodiment of the present invention.

The base 8 is rectangular as viewed from above. The base 8 has dimensions of 10×10 mm to 50×50 mm as viewed from above, and a height of 0.5 to 20 mm.

The frame 9 surrounds the upper surface of the base 8. The frame 9 is rectangular as viewed from above, and has dimensions of 10×10 mm to 50×50 mm and a height of 2 to 15 mm. The frame has a thickness of 0.5 to 2 mm.

The base 8 and the frame 9 may be formed from, for example, a metal such as iron, copper, nickel, chromium, cobalt, molybdenum, or tungsten, or an alloy of these metals, such as a copper-tungsten alloy, a copper-molybdenum alloy, or an iron-nickel-cobalt alloy. An ingot formed from such a metal material may undergo metal working, such as rolling or punching, to prepare a metal member that serves as the base 8.

The frame 9 has through-holes 91 in its side walls. Insulating terminals formed from sintered aluminum oxide, which electrically connect the inside and outside of the high-frequency board 1 or the high-frequency package 10, are inserted and fixed in the through-holes 91. In the high-frequency package 10, the high-frequency board 1 serves as input-output terminals.

Structure of High-Frequency Module

Figure 18:
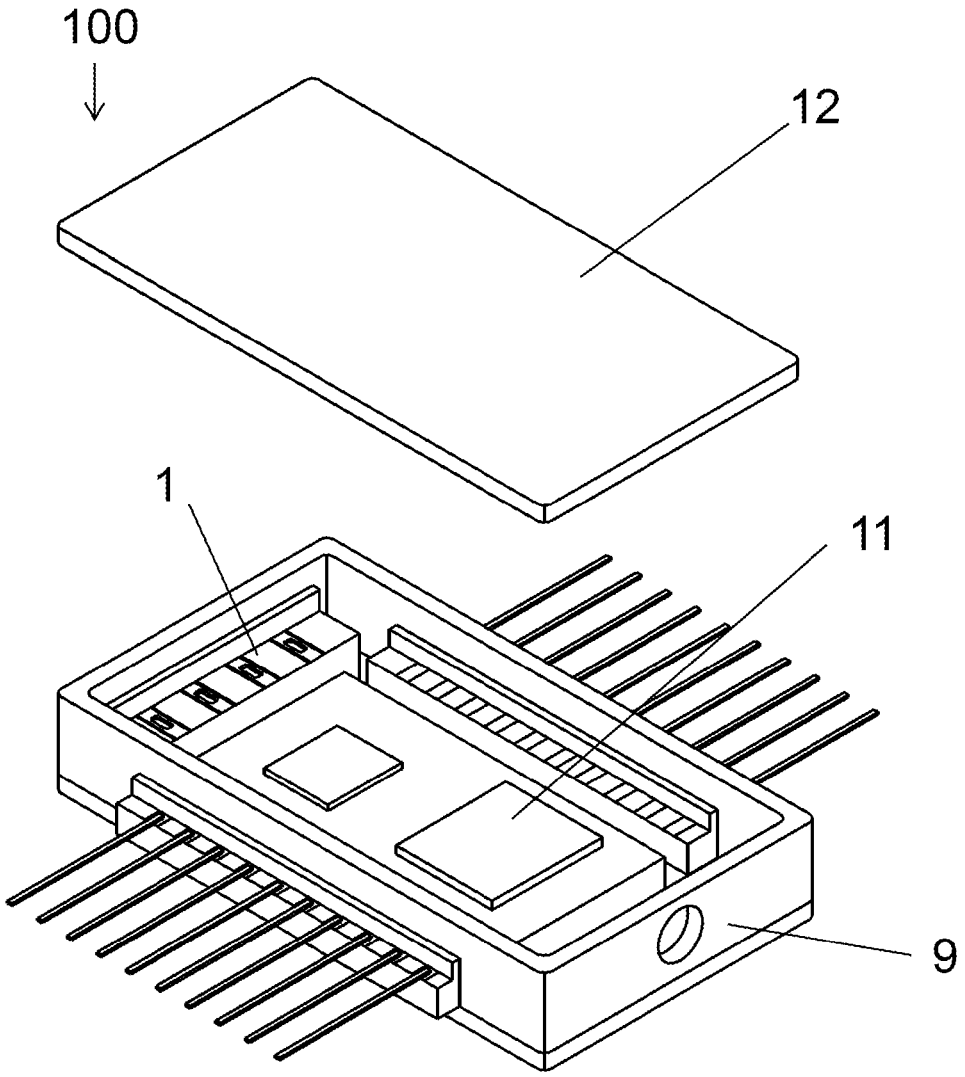
FIG. 18 is a perspective view of a high-frequency module according to an embodiment of the present invention.

FIG. 18 is a perspective view of a high-frequency module 100 according to an embodiment of the present invention. In the figure, the high-frequency module 100 includes the high-frequency package 10 according to the embodiment of the present invention, a semiconductor device 11, and a lid 12.

The semiconductor device 11 is, for example, a laser diode (LD). The semiconductor device 11 may be, for example, a photodiode (PD). For an LD semiconductor, another through-hole may be formed in the frame 9 to connect an optical fiber, in addition to the through-hole 91 through which the high-frequency board 1 or an insulating terminal is to be mounted.

The lid 12 is joined to the upper edge of the frame 9 to cover the inside of the high-frequency package 10. The lid 12 is rectangular as viewed from above, and has dimensions of 10×10 mm to 50×50 mm and a height of 0.5 to 2 mm. The lid 12 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. An ingot formed from such a metal material may undergo metal working, such as rolling or punching, to prepare a metal member that serves as the lid 12.

The present invention is not limited to the above embodiments, but may be modified variously without departing from the spirit and scope of the invention. Modifications contained in the claims can fall within the scope of the present invention.

REFERENCE SIGNS LIST

1 high-frequency board
2 insulating substrate
21 recess
22 ground conductor layer
23 internal ground conductor layer
24 connecting line conductor
3 first line conductor
31 first separator
32 first electrode pad
33 first line
4 second line conductor
41 second separator
42 second electrode pad
43 second line
51 first capacitor
52 second capacitor
7 notch
71 metallization layer
8 base
9 frame
91 through-hole
10 high-frequency package
11 semiconductor device
12 lid
100 high-frequency module

The invention claimed is:

1. A high-frequency board, comprising:

an insulating substrate having an upper surface [with a recess];

a first line conductor located on the upper surface [of the insulating substrate]; [and]

a second line conductor located on the upper surface [of the insulating substrate and extending parallel to the first line conductor with a space from the first line conductor as viewed from above,]; *and*

*a ground conductor layer located on the upper surface with a space from the first line conductor and the second line conductor,* wherein the [recess is located on] *ground conductor layer comprises* a [first] *third* region of the upper surface [of the insulating substrate between the first line conductor and the second line conductor, extends parallel to the first line conductor and the second line conductor as viewed from above, and has a lower dielectric constant than the insulating substrate], *and a first region with a space from the third region,* wherein the first line conductor includes a pair of first electrode pads and a pair of first lines, the pair of *the* first electrode pads is separated by a first separator and [facing] *face* each other across the first separator, and each of the [pair of] first lines connecting to [the] *a* corresponding first electrode pad *of the first electrode pads*, wherein the second line conductor includes a pair of second electrode pads and a pair of second lines, the pair of *the* second electrode pads is separated by a second separator and [facing] *face* each other across the second separator, and each of the [pair of] second lines connecting to [the] *a* corresponding second electrode pad *of the second electrode pads*, wherein, [in] a first direction [in which the first line conductor and the second line conductor extend, the recess extends from one of the pair of] *is a direction in which the* first electrode pads [to the other of the pair of first electrode pads through the first separator in the first region] *face each other* as viewed from above, [and]

wherein, [in] *as viewed from above,* a second direction [intersecting with] *is orthogonal to* the first direction[, the pair of first electrode pads is located to face the pair of second electrode pads across the recess]*, and*

*wherein, as viewed from above, the first line conductor and the second line conductor are located between the first region and a second region of the upper surface in the second direction.*

2. The high-frequency board according to claim [1] *23*, wherein each of the [pair of] first electrode pads has a connection end connecting to [the] *a* corresponding first line *of the pair of the first lines*, and in the first direction, the recess extends from the connection end of the one of the [pair of] first electrode pads to the connection end of [the] *an* other of the [pair of] first electrode pads as viewed from above.

3. The high-frequency board according to claim 1, wherein the first separator and the second separator are recessed.

4. The high-frequency board according to claim [1] *23*, wherein in the first direction, the recess has an end side wall with a notch.

5. The high-frequency board according to claim 4, wherein the notch has a surface covered with a metallization layer.

[6. The high-frequency board according to claim 1, further comprising:

a ground conductor layer located on the upper surface of the insulating substrate with a space from the first line conductor and the second line conductor.]

7. A high-frequency package, comprising:

a base;

a frame bonded to [an upper surface of] the base[, the frame having a through-hole]; and the high-frequency board according to claim 1 fixed [in the through-hole of] *to* the frame.

8. A high-frequency module, comprising:

the high-frequency package according to claim 7;

a semiconductor device mounted on [the upper surface of] the base, and electrically connected to the high-frequency board [of the high-frequency package]; and a lid joined to [an upper end of] the frame[, the lid] *and* covering the semiconductor device [and an inside of the high-frequency package].

9. The high-frequency board according to claim 1, further comprising:

a first capacitor located on the first separator; and a second capacitor located on the second separator.

10. The high-frequency board according to claim [1] *23*, wherein when viewed from above, the recess comprises:

a first portion extending along [to] the first direction from [the] one of the [pair of] first electrode pads to [the] *an* other of the [pair of] first electrode pads; and a second portion extending along [to] the second direction from the first separator to the second separator and being continuous with the first portion.

11. The high-frequency board according to claim 4, wherein the notch extends over a region between *one of* the first *lines* and *one of the* second lines in the [first] *third* region as viewed from above.

12. The high-frequency board according to claim 1, wherein a width of *each of* the *pair of the* first electrode [pad] *pads* is larger than a width of *each of* the *pair of the* first [line] *lines* in the second direction, and a width of *each of* the *pair of the* second electrode [pad] *pads* is larger than a width of *each of* the *pair of the* second [line] *lines* in the second direction.

*13. The high-frequency module according to claim 8, wherein*

*the lid covers an inside of the high-frequency package.*

*14. The high-frequency package according to claim 7, wherein*

*the frame includes at least one through-hole.*

*15. The high-frequency package according to claim 14, wherein*

*the high frequency board is fixed in the at least one through-hole to the frame.*

*16. The high-frequency package according to claim 14, wherein*

*the frame includes an other through-hole which is different from the at least one through-hole.*

*17. The high-frequency package according to claim 7, wherein*

*at least three side walls of the frame include a through-hole.*

*18. The high-frequency board according to claim 1, wherein*

*the third region is located between the first line conductor and the second line conductor in the second direction.*

*19. The high-frequency board according to claim 18, wherein,*

*as viewed from above, a distance X1 between the third region and one of the first lines is equal to a distance X2 between the third region and one of the second lines.*

*20. The high-frequency board according to claim 1, wherein*

*as viewed from above, a first distance between one of the first lines and the first region is smaller than a second distance between one of the first electrode pads and the first region in the second direction.*

*21. The high-frequency board according to claim 20, wherein*

*as viewed from above, a third distance between one of the second lines and the second region is smaller than a fourth distance between one of the second electrode pads and the second region in the second direction.*

*22. The high-frequency board according to claim 21, wherein*

*the first distance is equal to the third distance, and*

*the second distance is equal to the fourth distance.*

*23. The high-frequency board according to claim 1, further comprising:*

*a recess located on the upper surface with a space from the first line conductor and the second line conductor and having a lower dielectric constant than the insulating substrate.*

*24. The high-frequency board according to claim 23, wherein,*

*the recess extends to cover the first separator and the second separator in the second direction.*

*25. The high-frequency board according to claim 23, wherein,*

*in the second direction, the recess extends outward over the pair of the first electrode pads and the pair of the second electrode pads.*

*26. The high-frequency board according to claim 24, wherein,*

*in the first direction, the recess extends from one of the first electrode pads to an other of the first electrode pads through the first separator in a region of the upper surface between the first line conductor and the second line conductor.*

*27. The high-frequency board according to claim 23, wherein,*

*in a cross-sectional view perpendicular to the upper surface, the recess has a step.*

*28. The high-frequency board according to claim 23, wherein,*

*in a cross-sectional view perpendicular to the upper surface, the recess further comprises a first section and a second section, and a first depth of the first section is different from a second depth of the second section.*

*29. The high-frequency board according to claim 23, wherein,*

*as viewed from above, a fifth distance between the recess and the first region is smaller than a sixth distance between one of the first electrode pads and the first region in the second direction.*

*30. The high-frequency board according to claim 29, wherein,*

*as viewed from above, a seventh distance between the recess and the second region is smaller than an eighth distance between one of the second electrode pads and the second region in the second direction.*

*31. The high-frequency board according to claim 30, wherein*

*the fifth distance is equal to the seventh distance, and*

*the sixth distance is equal to the eighth distance.*

*32. The high-frequency board according to claim 23, wherein*

*the recess extends parallel to the first line conductor and the second line conductor as viewed from above.*

*33. The high-frequency board according to claim 1, wherein,*

*the second line conductor extends parallel to the first line conductor with a space from the first line conductor as viewed from above.*

*34. The high-frequency board according to claim 1, wherein*

*the ground conductor layer further comprises the second region of the upper surface.*

* * * * *